(12) United States Patent
Yoshikawa et al.

(10) Patent No.: US 8,593,810 B2
(45) Date of Patent: Nov. 26, 2013

(54) COOLING DEVICE

(75) Inventors: Minoru Yoshikawa, Tokyo (JP); Hitoshi Sakamoto, Tokyo (JP); Takeya Hashiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 229 days.

(21) Appl. No.: 13/143,416

(22) PCT Filed: Jan. 14, 2010

(86) PCT No.: PCT/JP2010/000182
§ 371 (c)(1),
(2), (4) Date: Jul. 6, 2011

(87) PCT Pub. No.: WO2010/084717
PCT Pub. Date: Jul. 29, 2010

(65) Prior Publication Data
US 2011/0279978 A1 Nov. 17, 2011

(30) Foreign Application Priority Data
Jan. 23, 2009 (JP) ................ P2009-013038

(51) Int. Cl.
*H05K 7/20* (2006.01)
(52) U.S. Cl.
USPC .......... 361/700; 361/679.52; 361/679.53; 361/689; 361/698; 361/699; 361/702; 165/80.4; 165/104.21; 165/104.26; 165/104.33; 165/185
(58) Field of Classification Search
USPC ............ 361/679.46–679.54, 688, 689, 361/690–697, 700–704, 715–724; 165/80.2–80.5, 104.14, 104.21, 165/104.33, 104.34, 185; 174/15.1, 16.3, 174/252, 254
See application file for complete search history.

(56) References Cited

U.S. PATENT DOCUMENTS

| 4,327,399 A | * | 4/1982 | Sasaki et al. .......... 361/698 |
| 4,727,454 A | * | 2/1988 | Neidig et al. ......... 361/689 |
| 4,727,455 A | * | 2/1988 | Neidig et al. ......... 361/700 |
| 5,161,090 A | * | 11/1992 | Crawford et al. ...... 361/700 |
| 5,283,715 A | * | 2/1994 | Carlsten et al. ....... 361/702 |
| 5,309,986 A | * | 5/1994 | Itoh ................ 165/104.26 |
| 6,474,074 B2 | * | 11/2002 | Ghoshal ............... 62/3.7 |

(Continued)

FOREIGN PATENT DOCUMENTS

JP 2000138485 A 5/2000
JP 2001136756 A 5/2001

(Continued)

OTHER PUBLICATIONS

International Search Report for PCT/JP2010/000182 mailed Mar. 16, 2010.

*Primary Examiner* — Michail V Datskovskiy

(57) ABSTRACT

A cooling device of the present invention includes: a substrate having a first surface which supports an electronic component and a second surface on an opposite side to the first surface; a container which can form a space between itself and the second surface of the substrate; and an evaporation section which is thermally connected to the electronic component supported on the substrate, which is arranged in the space so that at least a portion thereof is in contact with a liquid within the space, and which changes a phase of at least a portion of the liquid to gas on a basis of heat generated by the electronic component.

10 Claims, 3 Drawing Sheets

(56) References Cited

U.S. PATENT DOCUMENTS

| | | | |
|---|---|---|---|
| 6,490,159 B1 * | 12/2002 | Goenka et al. | 361/700 |
| 6,785,135 B2 * | 8/2004 | Ohmi et al. | 361/700 |
| 6,788,537 B2 * | 9/2004 | Saita et al. | 361/700 |
| 6,820,684 B1 * | 11/2004 | Chu et al. | 165/104.33 |
| 6,827,134 B1 * | 12/2004 | Rightley et al. | 165/104.26 |
| 6,894,900 B2 * | 5/2005 | Malone | 361/700 |
| 6,901,994 B1 * | 6/2005 | Jin-Cherng et al. | 165/104.26 |
| 6,976,527 B2 * | 12/2005 | Kirshberg et al. | 165/104.33 |
| 6,999,314 B2 * | 2/2006 | Tonosaki et al. | 361/700 |
| 7,176,382 B1 * | 2/2007 | Shi et al. | 174/254 |
| 7,190,582 B2 * | 3/2007 | Tonosaki et al. | 361/700 |
| 7,213,338 B2 * | 5/2007 | Tonosaki et al. | 29/890.035 |
| 7,814,655 B2 * | 10/2010 | Schulz-Harder | 29/890.032 |
| 8,081,460 B2 * | 12/2011 | Ishida et al. | 361/700 |
| 8,305,762 B2 * | 11/2012 | Wits et al. | 361/720 |
| 2004/0075181 A1 * | 4/2004 | Hara | 261/99 |
| 2004/0244963 A1 * | 12/2004 | Hazelton | 165/272 |
| 2009/0050301 A1 * | 2/2009 | Ishida et al. | 165/104.33 |

FOREIGN PATENT DOCUMENTS

| | | |
|---|---|---|
| JP | 2003214779 A | 7/2003 |
| JP | 2004044916 A | 2/2004 |
| JP | 2004044917 A | 2/2004 |
| JP | 2004190985 A | 7/2004 |
| JP | 2004327481 A | 11/2004 |
| JP | 2007208123 A | 8/2007 |

* cited by examiner

COOLING DEVICE

This application is the National Phase of PCT/JP2010/000182, filed Jan. 14, 2010, which is based upon and claims the benefit of priority from Japanese patent application No. 2009-013038, filed Jan. 23, 2009, the disclosure of which is incorporated herein in its entirety by reference.

TECHNICAL FIELD

The present invention relates to a cooling device.

BACKGROUND ART

Electronic components (semiconductor chips) such as LSIs and ICs are used in an electronic device such as a computer. If the temperature of the electronic components rises due to heat generation, it may become difficult to realize stable high-speed operation in some cases. Consequently, techniques for cooling electronic components as disclosed in the following Patent Documents have been proposed.

PRIOR ART DOCUMENTS

Patent Documents

[Patent Document 1] Japanese Unexamined Patent Application, First Publication No. 2001-136756

[Patent Document 2] Japanese Unexamined Patent Application, First Publication No. 2003-214779

[Patent Document 3] Japanese Unexamined Patent Application, First Publication No. 2004-327481

[Patent Document 4] Japanese Unexamined Patent Application, First Publication No. 2007-208123

SUMMARY OF THE INVENTION

Problem to Solved by the Invention

Due to improvements in the integration level of electronic components in recent years, the heat generation amount (heat generation density) of an electronic component has increased significantly. However, when cooling an electronic component having a high level of heat generation amount to a desired temperature using a cooling device such as heat sink, the size of the cooling device may need to be increased. As a result, the electronic device may become large.

An exemplary object of the present invention is to provide a cooling device that can suppress an increase in size, and can cool an electronic component efficiently.

Means for Solving the Problem

According to an aspect of the present invention, there is provided a cooling device including: a substrate having a first surface which supports an electronic component and a second surface on an opposite side to the first surface; a container which can form a space between itself and the second surface of the substrate; and an evaporation section which is thermally connected to the electronic component supported on the substrate, which is arranged in the space so that at least a portion thereof is in contact with a liquid within the space, and which changes a phase of at least a portion of the liquid to gas on a basis of heat generated by the electronic component.

Effect of the Invention

According to the present invention, an increase in size can be suppressed, and an electronic component can be cooled efficiently.

EMBODIMENTS FOR CARRYING OUT THE INVENTION

Hereunder, exemplary embodiments of the present invention are described, with reference to the drawings. In the following description, an XYZ-orthogonal coordinate system is set. Positional relationship of each section is described with reference to this XYZ-orthogonal coordinate system. A predetermined direction in a horizontal plane is set as an X-axis direction. The direction orthogonal to the X-axis direction in the horizontal plane is set as a Y-axis direction. The direction orthogonal respectively to the X-axis direction and the Y-axis direction (vertical direction or up-down direction) is set as a Z-axis direction. The directions of rotation (tilt) about the X-axis, the Y-axis, and the Z-axis are respectively set to a θX direction, a θY direction, and a θZ direction.

<First Exemplary Embodiment>

Figure 1:
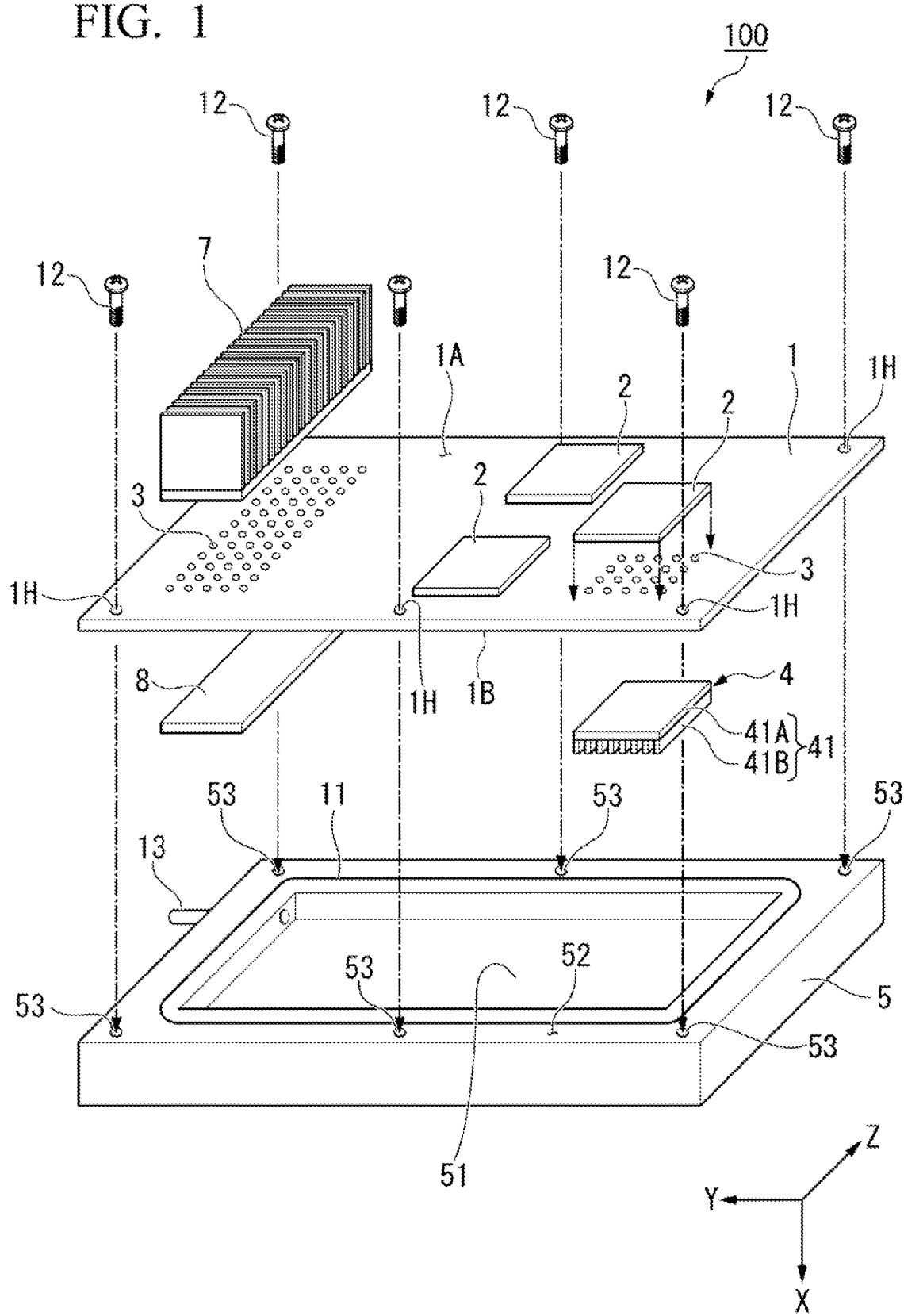
FIG. 1 is an assembly diagram showing an example of a cooling device according to a first exemplary embodiment of the present invention.
Figure 2:
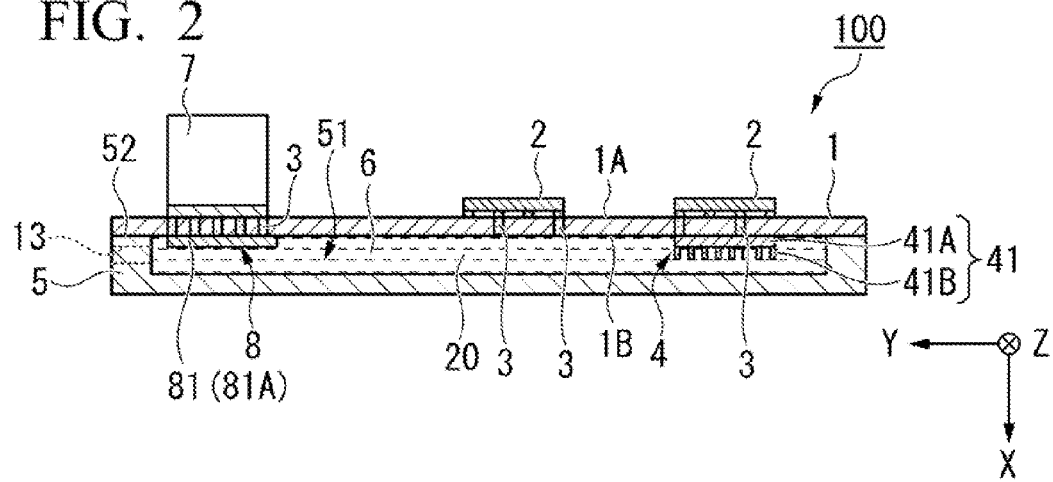
FIG. 2 is a side cross-sectional view showing an example of the cooling device according to the first exemplary embodiment of the present invention.

A first exemplary embodiment is described. FIG. 1 is an assembly diagram showing an example of a cooling device 100 according to the first exemplary embodiment. FIG. 2 is a side cross-sectional view showing an example of the cooling device 100 according to the first exemplary embodiment.

As shown in FIG. 1 and FIG. 2, the cooling device 100 includes a substrate 1, a container 5, and an evaporation section 4. The substrate 1 has a first surface 1A which supports an electronic component 2, and a second surface 1B which is a surface on an opposite side to the first surface 1A. The container 5 has a container cavity which forms a space 20 under the second surface 1B of the substrate 1. The evaporation section 4 is thermally connected to the electronic component 2 supported on the substrate 1. The evaporation section 4 is arranged in the space 20 so that at least a portion thereof is in contact with a liquid 6 within the space 20. The evaporation section 4 changes the phase of at least a portion of the liquid 6 to gas on the basis of heat generated by the electronic component 2.

The cooling device 100 further includes a condensation section 8. The condensation section 8 is arranged in the space 20 so that at least a portion thereof is in contact with either the liquid 6 or gas within the space 20. The condensation section 8 takes heat of the gas within the space 20, and changes the phase of at least a portion of the gas to liquid.

The cooling device 100 further includes a heat sink 7 which is thermally connected to the condensation section 8, and which releases heat from the condensation section 8.

In the present exemplary embodiment, the electronic component 2 is a semiconductor element (semiconductor chip) such as an LSI or IC. The electronic component 2 is driven and thereby generates heat.

The substrate 1 has the first surface 1A which supports the electronic component 2, and the second surface 1B facing in an opposite direction to the first surface 1A. In FIG. 1 and FIG. 2, the first surface 1A faces in the −X direction, and the second surface 1B faces in the +X direction. The second surface 1B faces the space 20.

The electronic component 2 is arranged in a first position on the first surface 1A. In the present exemplary embodiment, the substrate 1 supports a plurality of electronic components 2. In the present exemplary embodiment, the substrate 1 supports three electronic components 2. The plurality of (three) electronic components 2 are arranged in a plurality of different first positions on the first surface 1A at intervals.

The container 5 is capable of supporting the substrate 1. In the present exemplary embodiment, the container 5 faces the second surface 1B of the substrate 1, and it supports at least a portion of the second surface 1B. The space 20 is formed between the container 5 and the substrate 1 supported on the container 5.

In the present exemplary embodiment, the container 5 has a concave section 51 and a supporting surface 52 which is arranged around the concave section 51 for supporting at least a portion of the second surface 1B of the substrate 1. With the second surface 1B of the substrate 1 being supported on the supporting surface 52 of the container 5, the space 20 is formed between the concave section 51 of the container 5 and the second surface 1B of the substrate 1.

In the present exemplary embodiment, the container 5 is composed of a metallic material. The metallic container 5 has excellent thermal conductivity (has a high coefficient of thermal conductivity). The container 5 may be composed of a synthetic resin. A synthetic resin can be easily molded, and therefore, a synthetic-resin made container 5 can be manufactured smoothly.

In the present exemplary embodiment, the substrate 1 and the container 5 are connected to and fixed on each other by male screws 12. The substrate 1 has through holes 1H, through which the male screws 12 can be arranged, in a plurality of positions. The container 5 has female thread grooves 53 in a plurality of positions on the supporting surface 52. The female thread grooves 53 are formed so as to correspond to the through holes 1H, and they are connected to the male screws 12. The male screws 12 are respectively arranged in the through holes 1H and the female thread grooves 53 in a state where the through holes 1H and the female thread grooves 53 are position-aligned and the supporting surface 52 of the container 5 and the second surface 1B of the substrate 1 are in contact with each other. With this configuration, the substrate 1 and the container 5 are connected and fixed.

In the present exemplary embodiment, the cooling device 100 further has a seal member 11 arranged between the second surface 1B of the substrate 1 and the supporting surface 52 of the container 5. The seal member 11 is an O-ring for example. The seal member 11 substantially seals the space 20. Moreover, the seal member 11 suppresses leakage of the liquid 6 in the space 20.

The space 20 is capable of retaining the liquid 6. The liquid 6 is a cooling medium for cooling the electronic component 2. It is preferable that the liquid 6 has a low boiling point. In the present exemplary embodiment, hydrofluoroether is used as the liquid 6. The liquid 6 may be hydrofluorocarbon. The liquid 6 may include both of hydrofluoroether and hydrofluorocarbon. Hydrofluoroether and hydrofluorocarbon have low boiling points. Hydrofluoroether and hydrofluorocarbon have an insulating property and are inert.

The evaporation section 4 is arranged on the second surface 1B of the substrate 1. In the present exemplary embodiment, the evaporation section 4 is configured with a first member 41 supported on the second surface 1B of the substrate 1. In the present exemplary embodiment, the first member 41 includes a plate member 41A connected to the second surface 1B, and a fin member 41B arranged on the plate member 41B. The first member 41 arranged on the second surface 1B is thermally connected to the electronic component 2 arranged on the first surface 1A.

The first member 41 is composed of a material with excellent thermal conductivity. In the present exemplary embodiment, the first member 41 is composed of a metallic material. In the present exemplary embodiment, the first member 41 is composed of copper. The first member 41 may be composed of aluminum. Moreover, the first member 41 may be composed of both copper and aluminum, and may also be composed of a material other than copper and aluminum (for example, another metallic material such as iron). The plate member 41A and the fin member 41B may be composed of different materials.

In the present exemplary embodiment, the substrate 1 has thermal via-holes 3 formed connecting between the first surface 1A and the second surface 1B. The thermal via-holes 3 include through holes formed so as to connect between the first surface 1A and the second surface 1B, and a metallic film formed on the inner surface of the through holes. The metallic film is formed by applying plating to the inner surface of the through holes. In the present exemplary embodiment, copper plating is applied to the inner surface of the through holes.

In the present exemplary embodiment, the electronic component 2 and the first member 41 (evaporation section 4) are connected via the thermal via-holes 3 formed in the substrate 1. The electronic component 2 is arranged on the first surface 1A side so as to face the thermal via-holes 3. The first member 41 is arranged on the second surface 1B side so as to face the thermal via-holes 3. The electronic component 2 is connected to at least a portion of the thermal via-holes 3. The first member 41 is connected to at least a portion of the thermal via-holes 3. The electronic component 2 is supported on the first surface 1A of the substrate 1 so that at least a portion thereof is in contact with the thermal via-holes 3. The first member 41 is supported on the second surface 1B of the substrate 1 so that at least a portion thereof is in contact with the thermal via-holes 3.

In the present exemplary embodiment, the electronic component 2 has pins. These pins include, for example, a signal pin or a power supply pin. The pins of the electronic component 2 can be arranged in the thermal via-holes 3. In the present exemplary embodiment, the pins and the thermal via-holes 3 of the electronic component 2 are connected by solder in a state where the pins are arranged in the thermal via-holes 3 (that is, in a state where the pins of the electronic component 2 are inserted in the thermal via-holes 3). Moreover, the first member 41 and the thermal via-holes 3 are connected by solder. With this configuration, the electronic component 2 and the first member 41 are fixed on the substrate 1, and the electronic component 2 and the first member 41 (evaporation section 4) are thermally connected via the thermal via-holes 3. The thermal via-hole 3 may also serve, for example, as a ground pin of a power supply. The first member 41 and the thermal via-holes 3 (substrate 1) may be connected with an adhesive material having a high level of thermal conductivity.

In the present exemplary embodiment, the surface of the first member 41 (evaporation section 4) facing the space 20 is a rough surface. In the present exemplary embodiment, the surface of the first member 41 (evaporation section 4) is surface-roughened, and has a predetermined level of surface roughness. In the present exemplary embodiment, the surface of the first member 41 (evaporation section 4) is roughened by sandblasting or the like so that the surface roughness becomes approximately several 10 μm to several 100 μm.

The heat sink 7 is supported on the first surface 1A of the substrate 1. The heat sink 7 is arranged in a second position on the first surface 1A which is different from the first position on the first surface 1A, on which the electronic component 2 is arranged. The heat sink 7 is capable of releasing heat of the electronic component 2 into the surrounding atmosphere (aerial space).

The condensation section 8 is arranged on the second surface 1B of the substrate 1. The condensation section 8 is arranged in a fourth position on the second surface 1B which is different from a third position on the second surface 1B, on which the evaporation section 4 is arranged.

In the present exemplary embodiment, the condensation section 8 is configured with a second member 81 supported on the second surface 1B of the substrate 1. In the present exemplary embodiment, the second member 81 includes a plate member 81A connected to the second surface 1B. The second member 81 arranged on the second surface 1B is thermally connected to the heat sink 7 arranged on the first surface 1A.

The second member 81 is composed of a material with excellent thermal conductivity. In the present exemplary embodiment, the second member 81 is composed of a metallic material. In the present exemplary embodiment, the second member 81 is composed of copper. The second member 81 may be composed of aluminum. The second member 81 may be composed of both copper and aluminum, and may also be composed of a material other than copper and aluminum (for example, another metallic material such as iron).

In the present exemplary embodiment, the heat sink 7 and the second member 81 (condensation section 8) are connected via the thermal via-holes 3 formed in the substrate 1. The heat sink 7 is arranged on the first surface 1A side so as to face the thermal via-holes 3. The second member 81 is arranged on the second surface 1B side so as to face the thermal via-holes 3. The heat sink 7 is connected to at least a portion of the thermal via-holes 3, and the second member 81 is connected to at least a portion of the thermal via-holes 3. The heat sink 7 is supported on the first surface 1A of the substrate 1 so that at least a portion thereof is in contact with the thermal via-holes 3. The second member 81 is supported on the second surface 1B of the substrate 1 so that at least a portion thereof is in contact with the thermal via-holes 3.

In the present exemplary embodiment, the heat sink 7 and the thermal via-holes 3 are connected by solder. The second member 81 and the thermal via-holes 3 are connected by solder. With this configuration, the heat sink 7 and the second member 81 are fixed on the substrate 1, and the heat sink 7 and the second member 81 (condensation section 8) are thermally connected via the thermal via-holes 3. The second member 81 and the thermal via-holes 3 (substrate 1) may be connected with an adhesive material having a high level of thermal conductivity. The heat sink 7 may be connected to the substrate 1 via a heat dissipation grease or heat dissipation sheet with excellent thermal conductivity.

In the present exemplary embodiment, the surface of the second member 81 (condensation section 8) facing the space 20 is a rough surface. In the present exemplary embodiment, the surface of the second member 81 (condensation section 8) is surface-roughened, and has a predetermined level of surface roughness. In the present exemplary embodiment, the surface of the second member 81 (condensation section 8) is roughened by sandblasting or the like so that the surface roughness becomes approximately several 10 μm to several 100 μm. The surface of the second member 81 (condensation section 8) may not have to be surface-roughened.

As with the first member 41, the second member 81 (condensation section 8) may include a plate member and a fin member connected to this plate member. The surface of the second member 81 (condensation section 8) which includes the plate member and the fin member may be surface-roughened. The surface of the second member 81 (condensation section 8) which includes the plate member and the fin member may not have to be surface-roughened.

In the present exemplary embodiment, the cooling device 100 includes a supply port 13 which is arranged in the container 5 and which supplies the liquid 6 into the space 20. The liquid 6 is supplied into the space 20 through the supply port 13, and thereby the liquid 6 is retained in the space 20.

In the present exemplary embodiment, the pressure of the space 20 is adjusted so that the boiling point of the liquid 6 inside the space 20 is at an approximate normal temperature (for example, 23° C.). In the present exemplary embodiment, the pressure of the space 20 is at least lower than the atmospheric pressure.

Next, an example of a method of supplying the liquid 6 into the space 20 is described. After the substrate 1 and the container 5 have been connected using the male screws 12, and the space 20 has been formed, the liquid 6 is supplied into the space 20 through the supply port 13. A predetermined amount of liquid LQ is supplied into the space 20.

After the predetermined amount of the liquid 6 has been supplied into the space 20, a suction device such as a vacuum pump is connected to the supply port 13 via a tube. Then, the suction device is operated to reduce the pressure inside the space 20. The suction device adjusts the pressure inside the space 20 so as to be at least lower than the atmospheric pressure. As a result of reducing the pressure of the space 20, the boiling point of the liquid 6 inside the space 20 decreases. In the present exemplary embodiment, the pressure inside the space 20 is adjusted so that the boiling point of the liquid 6 inside the space 20 becomes an approximate normal temperature.

After reducing the pressure of the space 20 using the suction device, the supply port 13 is closed. For example, a seal member is arranged on the supply port 13, and thereby the supply port 13 is closed and the state of the lowered pressure of the space 20 is maintained. In order to close the supply port 13, for example, a valve mechanism capable of opening and closing the supply port 13 may be used.

As a result of reducing the pressure inside the space 20, the pressure difference between the pressure of the first surface 1A side of the substrate 1 (atmospheric pressure) and the pressure of the second surface 1B side (pressure within the space 20) may cause the substrate 1 to deform in some cases. Deformation of the substrate 1 may be suppressed by arranging, for example, a rim member on the inside of the space 20.

Figure 3:
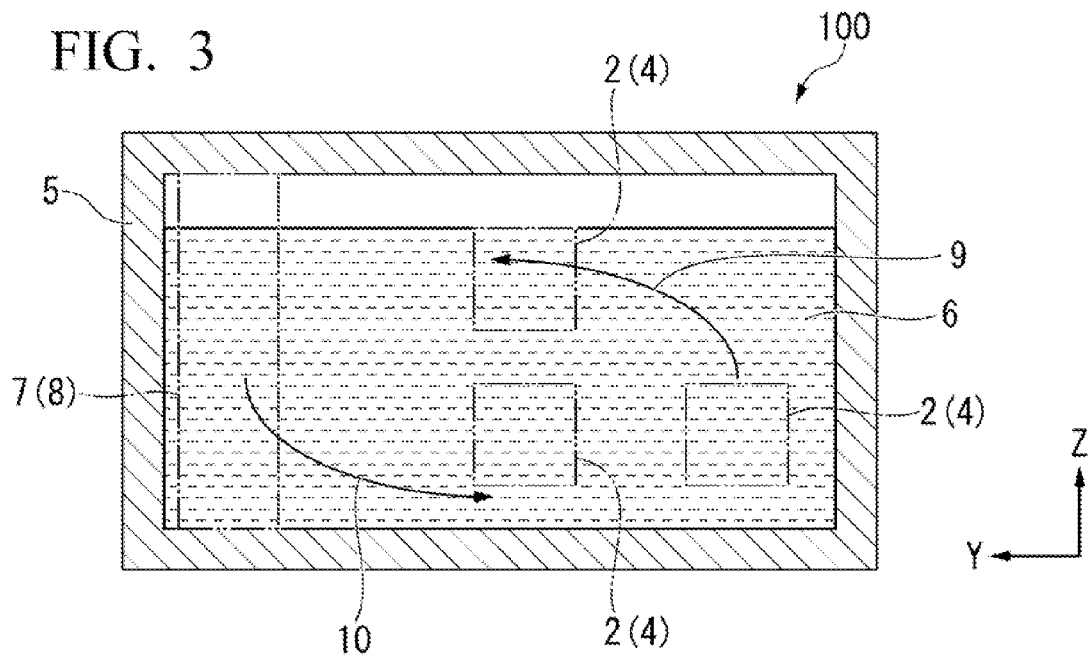
FIG. 3 is a schematic diagram showing an operation example of the cooling device according to the first exemplary embodiment of the present invention.

Next, an operation example of the cooling device 100 according to the present exemplary embodiment is described, with reference to FIG. 3. In the present exemplary embodiment, as shown in FIG. 3, the electronic component 2 is driven in a state where the cooling device 100 is arranged so that the first surface 1A and the second surface 1B are parallel with the YZ plane.

As shown in FIG. 3, in the present exemplary embodiment, a predetermined amount of the liquid 6 is retained in the space 20 so that the position (height) of the surface of the liquid 6 inside the space 20 is higher than the position (height) of the electronic component 2 in relation to the Z-axis direction.

When the electronic component 2 is driven and heat is generated, the heat of the electronic component 2 is transmitted to the second surface 1B side of the substrate 1. In the present exemplary embodiment, heat generated by the electronic component 2 is transmitted to the first member 41 (evaporation section 4) via the thermal via-holes 3. As a result, the temperature of the first member 41 (evaporation section 4) rises.

As a result of the temperature rise in the evaporation section 4, at least a portion of the liquid 6 within the space 20 which is in contact with the evaporation section 4 is heated, and the phase thereof changes to gas. That is to say, in a case where the temperature of the evaporation section 4 rises on the basis of the heat generated by the electronic component 2, and the temperature of at least a portion of the liquid 6 in the space 20 which is in contact with the evaporation section 4 rises to or above the boiling point of the liquid 6, the phase of at least a portion of the liquid 6 changes to gas. As a result, bubbles are generated in the vicinity of the evaporation section 4.

In the present exemplary embodiment, the pressure of the space 20 is adjusted so that the boiling point of the liquid 6 inside the space 20 is at an approximate normal temperature. Therefore, with the heat generated by the electronic component 2, the phase of at least a portion of the liquid 6 in contact with the evaporation section 4 thermally connected to the electronic component 2 can be smoothly changed to gas.

In the present exemplary embodiment, since the surface of the evaporation section 4 is rough, it is possible to smoothly generate gas from the liquid 6 in contact with the evaporation section 4. That is to say, since the surface of the evaporation section 4 is rough, the number of nuclei of bubbles to be generated can be increased. As a result, the phase of the liquid 6 can be smoothly changed to gas.

The gas generated by the evaporation section 4 moves in the +Z direction in the liquid 6 (that is to say, the gas generated by the evaporation section 4 rises). Due to the gas moving in the +Z direction in the liquid 6, the volume of the gas (bubbles) increases (that is to say, the volume of the gas (bubbles) expands).

In the space 20, there is generated a flow of the liquid 6 as shown for example by arrow 9 in FIG. 3, and the gas generated by the evaporation section 4 moves toward the condensation section 8 thermally connected to the heat sink 7. That is to say, the gas generated by the evaporation section 4 moves toward the condensation section 8 together with the liquid 6 flowing as shown by arrow 9.

It is preferable that the clearance in the fin member 41B is approximately 1 millimeter to several millimeters so that the gas (bubbles) generated by the evaporation section 4 can smoothly move toward the condensation section 8, that is, so that the fin member 41B does not obstruct the gas (bubbles) generated by the evaporation section 4.

Due to the condensation section 8 coming in contact with the liquid 6 and the gas (bubbles) that have moved to the condensation section 8, heat of the liquid 6 and gas is taken by the condensation section 8. Due to the heat of the gas being taken by the condensation section 8, the phase of at least a portion of the gas changes to liquid 6.

Heat of the condensation section 8 that has taken the heat from the gas is transmitted via the thermal via-holes 3 to the heat sink 7, and is then released via the heat sink 7 to the surrounding atmosphere.

The liquid 6, the phase of which has been changed from gas by the condensation section 8, or the liquid 6 in the vicinity of the condensation section 8 moves downward by the action of the gravitational force. Moreover, in the space 20 there is generated a flow of the liquid 6 as shown by arrow 10 in FIG. 3 for example, and the liquid 6 generated by the condensation section 8, or the liquid 6 in the vicinity of the condensation section 6 moves toward the evaporation section 4.

In this manner, in the present exemplary embodiment, in the space 20 with the liquid 6 retained therein, gasification (evaporation) of the liquid 6 in the evaporation section 7 and liquefaction (condensation) of the gas in the condensation section 8 are executed. That is to say, in the space 20, there is generated a circulation cycle of evaporation and condensation.

This circulation cycle of evaporation and condensation is performed by latent heat, which is not associated with temperature rise. Therefore, the heat transportation capacity of this circulation cycle reaches several times to several ten times that in the heat conduction of copper for example.

The cooling device 100 of the present exemplary embodiment has a flat plate outer shape, and it configures a flat plate ebullient cooling device capable of cooling the electronic component 2 by the above circulation cycle.

As described above, according to the present exemplary embodiment, in a state where the liquid 6 and the substrate 1 are directly in contact with each other, a flow of the liquid 6 and gas can be generated by the action of the gravitational force. That is to say, it is possible to generate a convection flow in the liquid 6. Therefore, the electronic component 2 supported on the substrate 1 can be efficiently cooled.

Moreover, since the evaporation section 4 is provided, then even with an electronic component 2 with a large amount of heat generation, this electronic component 2 can be efficiently cooled. Furthermore, since heat generated by the electronic component 2 can be efficiently taken away, the size (thickness) of the cooling device 100 can be reduced, and consequently, the size of an electronic device with the electronic component 2 and the cooling device 100 mounted therein can be reduced. Furthermore, it is also possible to mount a fast processor as an electronic component 2.

Moreover, in the present exemplary embodiment, even in a case of having a plurality of electronic components 2, which are the source of heat, with use of the substrate 1 which supports these electronic components 2 and the liquid 6 which is in contact with the substrate 1, heat generated by each electronic component 2 is released first, and then the gas generated on the basis of this heat is moved to the condensation section 8. As a result, a high level of cooling efficiency can be obtained while suppressing an increase in the number of condensation sections 8 and heat sinks 7 thermally connected to the condensation section 8. That is to say, a plurality of electronic components 2 can be efficiently cooled without being dependent on the layout of the electronic components 2. For example, even if the heat generation density locally becomes higher on the substrate 1, the plurality of electronic components 2 can be cooled respectively, by the convection flow of the liquid 6.

Moreover, even in a case where a fan device is provided on the heat sink 7, an increase in the number of fan devices can be suppressed. Therefore, an increase in the size of the cooling device 100 can be suppressed, and the level of noise can also be suppressed. Furthermore, electrical power consumption of the fan device can be suppressed.

Moreover, in the present exemplary embodiment, as the liquid 6, there is used an inert liquid (hydrofluoroether, hydrofluorocarbon, or the like) which has an insulating property and which is capable of suppressing corrosion of the substrate 1. Therefore, deterioration of the cooling device 100 can be suppressed.

Furthermore, in the present exemplary embodiment, the configuration is such that the liquid 6 flows inside the space 20 which has a predetermined size. Therefore, the degree of freedom in selection of the liquid 6 for use can be increased. For example, even in a case of using a liquid 6 with a low level of surface tension, the electronic component 2 can be cooled by making the liquid 6 flow smoothly inside the space 20.

Moreover, in the present exemplary embodiment, the structure of the cooling device 100 is simple, and a broad region of the first surface 1A of the substrate 1 can be cooled. Therefore, it is possible to suppress a reduction in the degree of freedom in the layout of the electronic component 2.

Furthermore, in the present exemplary embodiment, electronic components 2 of different shapes and sizes can be generally arranged on the first surface 1A of the substrate 1 supported in the container 5. Moreover, connectors and cables of an input/output interface can be arranged on the first surface 1A of the substrate 1.

Furthermore, in the present exemplary embodiment, the space 20 is formed between the substrate 1 and the container 5, and the substrate 1 and the container 5 can be separated from each other. Consequently it is possible to smoothly execute various types of operations including an operation of arranging the electronic component 2 on the substrate 1, for example. Moreover, the substrate 1 and the container 5 can be respectively provided with generality.

In the present exemplary embodiment, there has been described an example of the case where the first member 41 and the electronic component 2 are connected via the thermal via-hole 3. However, the thermal via-hole 3 may not need to be provided. In this case, heat of the electronic component 2 is transmitted via the substrate 1 to the first member 41 arranged on the second surface 1B. For example, if the substrate 1 has excellent thermal conductivity, heat of the electronic component 2 is well transmitted via the substrate 1 to the first member 41. A solder pad may be provided on the second surface 1B of the substrate 1 to thereby connect the first member 41 and the substrate 1 via the solder pad.

Similarly, the thermal via-hole 3 between the heat sink 7 and the second member 81 may be omitted. In this case, heat of the second member 81 is transmitted via the substrate 1 to the heat sink 7 arranged on the first surface 1A. A solder pad may be provided on the second surface 1B of the substrate 1 to thereby connect the second member 81 and the substrate 1 via the solder pad.

In the present exemplary embodiment, the first member 41 may be omitted. In this case, at least a portion of the second surface 1B of the substrate 1 functions as an evaporation section.

In the present exemplary embodiment, the second member 81 may be omitted. In this case, at least a portion of the second surface 1B of the substrate 1 functions as a condensation section.

<Second Exemplary Embodiment>

Next, a second exemplary embodiment is described. In the following description, the same reference symbols are given to the same or similar constituents as those in the above exemplary embodiment, and descriptions thereof are simplified or omitted.

Figure 4:
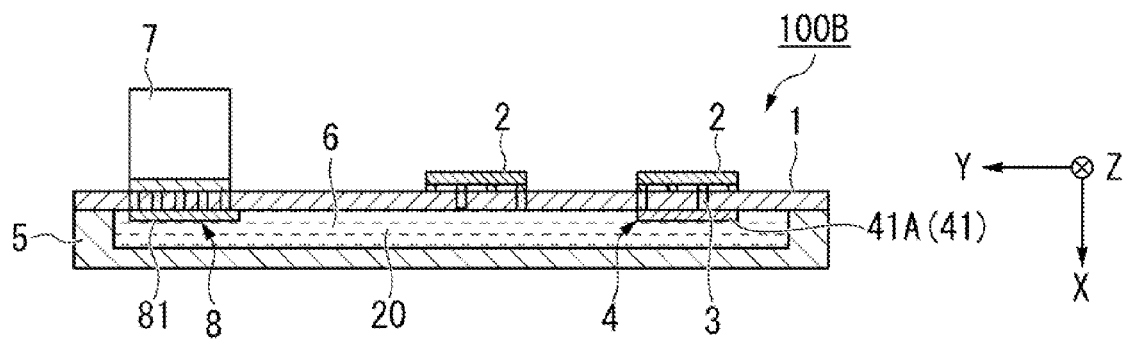
FIG. 4 is a side cross-sectional view showing an example of a cooling device according to a second exemplary embodiment of the present invention.

FIG. 4 is a diagram showing an example of a cooling device 100B according to the second exemplary embodiment. As shown in FIG. 4, the cooling device 100B has a first member 41 which functions as an evaporation section 4. In the present exemplary embodiment, the first member 41 includes no fin member, and it is configured with a plate member 41A. The surface of the plate member 41A is surface-roughened.

Accordingly, the evaporation section 4 does not have to be provided with a fin member.

In the present exemplary embodiment, a fin member may be arranged on a second member 81 while providing no fin member on the first member 41.

<Third Exemplary Embodiment>

Next, a third exemplary embodiment is described. In the following description, the same reference symbols are given to the same or similar constituents as those in the above exemplary embodiment, and descriptions thereof are simplified or omitted.

Figure 5:
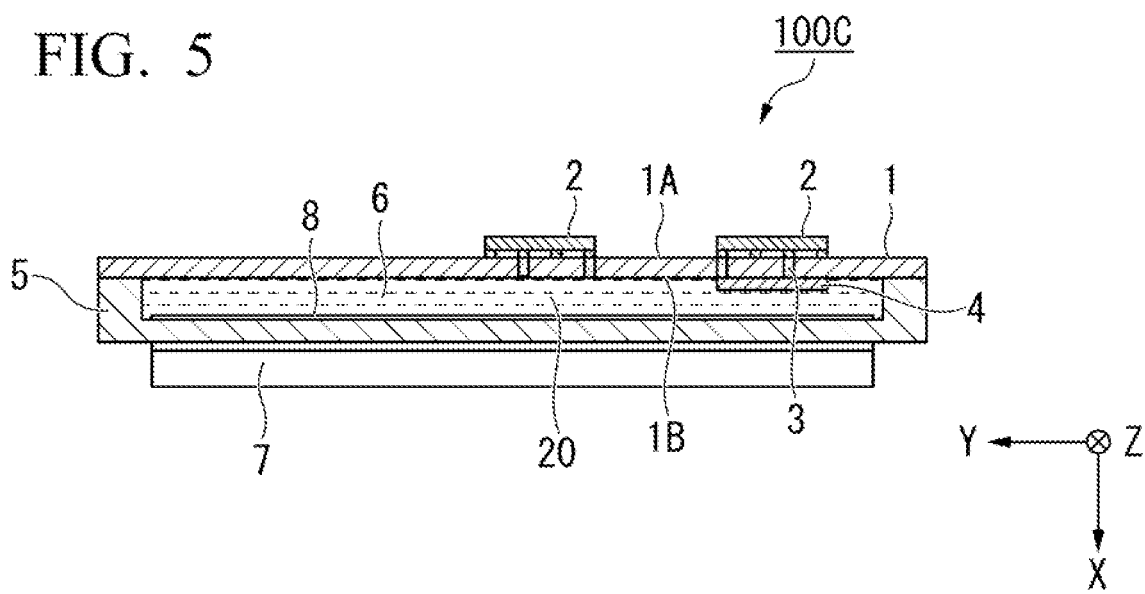
FIG. 5 is a side cross-sectional view showing an example of a cooling device according to a third exemplary embodiment of the present invention.
Figure 6:
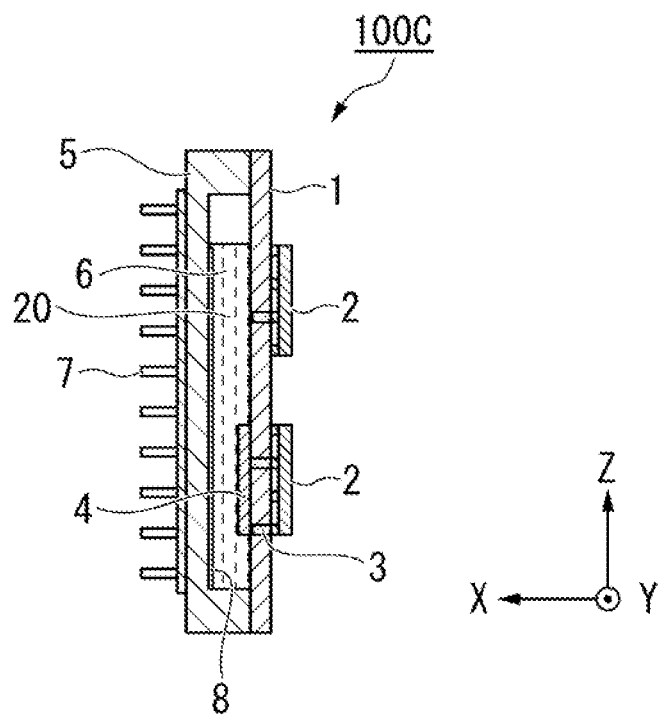
FIG. 6 is a side cross-sectional view showing an example of the cooling device according to the third exemplary embodiment of the present invention.

FIG. 5 and FIG. 6 are diagrams respectively showing an example of a cooling device 100° C. according to the third exemplary embodiment. As shown in FIG. 5, the cooling device 100° C. includes a substrate 1, a container 5, an evaporation section 4, a condensation section 8, and a heat sink 7.

The substrate 1 has a first surface 1A which supports an electronic component 2, and a second surface 1B on an opposite side to the first surface 1A. The container 5 has a container cavity which forms a space 20 under the second surface 1B of the substrate 1. The evaporation section 4 is thermally connected to the electronic component 2 supported on the substrate 1. The evaporation section 4 is arranged in the space 20 so that at least a portion thereof is in contact with a liquid 6 within the space 20. The evaporation section 4 changes the phase of at least a portion of the liquid 6 to gas on the basis of heat generated by the electronic component 2. The condensation section 8 is arranged in the space 20 so that at least a portion thereof is in contact with at least either of the liquid 6 and gas within the space 20. The condensation section 8 takes heat of the gas, and changes the phase of at least a portion of the gas to liquid 6. The heat sink 7 is thermally connected to the condensation section 8, and releases heat from the condensation section 8.

In the present exemplary embodiment, the heat sink 7 is arranged in the container 5. In the present exemplary embodiment, the heat sink 7 is integrated with the container 5. The heat sink 7 and the container 5 may respectively be separate bodies. In a case where the heat sink 7 and the container 5 are provided as separate bodies, the heat sink 7 and the container 5 are thermally connected via a heat dissipation grease or heat dissipation sheet with excellent thermal conductivity.

Also in the present exemplary embodiment, the electronic component 2 can be efficiently cooled.

In the respective exemplary embodiments described above, the cooling devices 100, 100B, and 100C are described with examples of a case where a semiconductor device (semiconductor chip) serving as an electronic component 2 is cooled. However, also in those cases of cooling any electronic component which generates heat other than semiconductor devices, the cooling device of each of the above exemplary embodiments may be applied. Moreover, the cooling device of each of the above exemplary embodiments may be applied to equipment related to air-conditioning for a server room.

While the invention has been described with reference to exemplary embodiments thereof, the invention is not limited to these embodiments. It will be understood by those of ordinary skill in the art that various changes in form and details of the present invention may be made therein without departing from the scope of the present invention.

This application is based upon and claims the benefit of priority from Japanese patent application No. 2009-013038, filed Jan. 23, 2009, the disclosure of which is incorporated herein in its entirety by reference.

INDUSTRIAL APPLICABILITY

The present invention can be applied to a cooling device. According to this cooling device, an increase in size can be suppressed, and an electronic component can be cooled efficiently.

REFERENCE SYMBOLS

1 Substrate
1A First surface
1B Second surface
2 Electronic component
3 Thermal via-hole
4 Evaporation section
5 Container
6 Liquid
7 Heat sink
8 Condensation section
13 Supply port
100, 100B, 100C Cooling device

The invention claimed is:

1. A cooling device comprising:
  a substrate having a first surface which supports an electronic component and a second surface on an opposite side to the first surface;
  a container which has a container cavity forming a space under the second surface of the substrate;
  an evaporation section which is thermally connected to the electronic component supported on the substrate, which is arranged in the space so that at least a portion thereof is in contact with a liquid within the space, and which changes a phase of at least a portion of the liquid to gas on a basis of heat generated by the electronic component; and
  a condensation section which is arranged in the space so that at least a portion thereof is in contact with at least either one of the liquid and gas within the space, and which takes heat of the gas and changes a phase of at least a portion of the gas to liquid,
  wherein the space is configured such that a convection flow of the liquid is generated within the space by gasification of the liquid in the evaporation section and liquefaction of the gas in the condensation section,
  a surface of the evaporation section and a surface of the condensation section are surface-roughened,
  the evaporation section is arranged on the second surface, and the electronic component and the evaporation section are connected via a thermal via-hole formed in the substrate, and the condensation section is arranged on the second surface, and a heat sink and the condensation section are connected via a thermal via-hole formed in the substrate.

2. A cooling device according to claim 1, wherein the evaporation section includes a fin member, and the condensation section includes a fin member.

3. A cooling device according to claim 1, further comprising a heat sink which is thermally connected to the condensation section, and which releases heat from the condensation section.

4. A cooling device comprising:
  a substrate having a first surface which supports an electronic component and a second surface on an opposite side to the first surface;
  a container which has a container cavity forming a space under the second surface of the substrate;
  an evaporation section which is thermally connected to the electronic component supported on the substrate, which is arranged in the space so that at least a portion thereof is in contact with liquid within the space, and which changes a phase of at least a portion of the liquid to gas on a basis of heat generated by the electronic component; and
  a condensation section which is arranged in the space so that at least a portion thereof is in contact with at least either one of the liquid and gas within the space, and which takes heat of the gas and changes a phase of at least a portion of the gas to liquid;
  a heat sink which is thermally connected to the condensation section, and which releases heat from the condensation section,
  wherein the space is configured such that a convection flow of the liquid is generated within the space by gasification of the liquids in the evaporation section and liquefaction of the gas in the condensation section,
  a surface of the evaporation section and a surface of the condensation section are surface-toughened, and
  the heat sink is arranged in a second position on the first surface, which is different from a first position of the first surface where the electronic component is arranged.

5. A cooling device according to claim 3, wherein the heat sink is arranged on the container.

6. A cooling device according to claim 1,
  wherein the container has a concave section and a supporting surface which is arranged around the concave section and which supports at least a portion of the second surface, and
  the cooling device comprises a seal member arranged between the second surface and the supporting surface.

7. A cooling device according to claim 1, wherein the space is substantially sealed.

8. A cooling device according to claim 1, wherein a pressure of the space is adjusted so that a boiling point of the liquid is at approximately 23° C.

9. A cooling device according to claim 1, further comprising a supply port which is arranged in the container and which supplies the liquid into the space.

10. A cooling device according to claim 1, wherein surface roughness of the evaporation section and surface roughness of the condensation section are approximately several 10 μm to several 100 μm.

* * * * *